United States Patent

Crooks et al.

Patent Number: 5,885,753
Date of Patent: Mar. 23, 1999

[54] POLYMERIC SELF-ASSEMBLED MONO- AND MULTILAYERS AND THEIR USE IN PHOTOLITHOGRAPHY

[75] Inventors: Richard M. Crooks, College Station, Tex.; Taisun Kim, Kang-Won Do, Rep. of Korea; Kwok-Chu Chan; Jonathan K. Schoer, both of College Station, Tex.

[73] Assignee: The Texas A&M University System, College Station, Tex.

[21] Appl. No.: 631,213

[22] Filed: Apr. 12, 1996

[51] Int. Cl.$^6$ .............................. G03C 5/00; B32B 31/00; B32B 7/04
[52] U.S. Cl. .................. 430/325; 430/323; 430/324; 156/272.2; 156/275.5; 428/420
[58] Field of Search .................................. 430/323, 324, 430/325; 156/272.2, 275.5; 428/420, 430

[56] References Cited

U.S. PATENT DOCUMENTS

| | | | |
|---|---|---|---|
| 4,539,061 | 9/1985 | Sagiv | 156/278 |
| 5,108,573 | 4/1992 | Rubinstein et al. | 204/290 R |
| 5,338,571 | 8/1994 | Mirkin et al. | 427/299 |

OTHER PUBLICATIONS

M. Itoh, "Preparation and Evaluation of Two Dimensional Polymer Films by Chemical Modification of an Alkanethiol Self–Assembled . . . ", J. Electrochem. Soc. Nov. 1995, vol. 142, No. 11, pp. 3696–3703.

T. Kim et al., "Polymeric Self–Assembling Monolayers" 1. Tetrahedron Letters, 1994, vol. 35, No. 51, pp. 9501–9504.

T. Kim et al., "Polymeric Self–Assembled Monolayers", 2. J. Am. Chem. Soc. 1995, vol. 117, pp. 3963–3967.

D. N. Batchelder, "Self–Assembled Monolayers containing Polydiacetylenes", J. Am. Chem. Soc. 1994, vol. 116, pp. 1050–1053.

Dubois et al., Annu.Rev.Phys.Chem., vol. 43, 1992, 437–463.

*Primary Examiner*—Janet Baxter
*Assistant Examiner*—Rosemary Ashton
*Attorney, Agent, or Firm*—Fish & Richardson P.C.

[57] ABSTRACT

A self-assembled multilayer and in particular polymeric self-assembled multilayer can be effectively produced from two or more self-assembled monolayers on a substrate where each of the self-assembled monolayers is produced for a block containing a first functional group and a second functional group where the second functional group is reacted with the first functional group. The production of polymerizable, self-assembled mono- and multi-layers from, e.g., blocks containing at least two acetylene groups and/or polymerizable end groups, is also provided. The polymerized mono- or multilayer can be employed in a variety of applications including photolithography.

19 Claims, 9 Drawing Sheets

POLYMERIC SELF-ASSEMBLED MONO- AND MULTILAYERS AND THEIR USE IN PHOTOLITHOGRAPHY

FIELD OF THE INVENTION

The present invention relates to self-assembled mono- and multilayers and, in particular, polymeric self-assembled mono- and multilayers as well as the use of self-assembled mono- and multilayers in certain applications such as photolithography.

BACKGROUND OF THE INVENTION

Self-assembled monolayers (SAMs) are known in the art. See, for example, Dubois et al., Annu. Rev. Phys. Chem., 1992, 43, p. 437 et seq., which is incorporated herein by reference. Recently, one class of SAM that has received considerable attention are organomercaptans. See, for example, Kim et al. "Polymeric Self-Assembling Monolayer. 1. Synthesis and Characterization of ω-Functionalized N-Alkanethiol Containing a Conjugated Diacetylene Group" Tetrahedron Letters, Vol. 35, No. 51, pp. 9501–9504, 1994; Kim et al., "Polymeric Self-Assembling Monolayer. 2. Synthesis and Characterization of Self-Assembled Polydiacetylene Mono- and Multilayers.", J. Am. Chem. Soc., 1995, 117, pp. 3963–3967; and Batchelder et al., "Self-Assembled Monolayer containing Polydiacetylenes", J. Am. Chem. Sc., 1994, 116, pp. 1050–1053, each of which are incorporated herein by reference in their entirety.

One area of study relating to SAMs has involved the stability of such monolayers. While in certain environments, e.g., water or air at room temperature, the SAM's can be considered robust, one disadvantage associated with the use of most SAMs relates to their fragility in environments that involve elevated temperatures and/or solvents able to penetrate the SAM.

One solution to this problem is represented by the polymerization of SAMs. Batchelder et al disclose the use of UV radiation in polymerizing SAMs produced from methyl-terminated diacetylene disulfide. While it has been found that polymerized SAMs have high structural integrity and are more rugged than their unpolymerized counterparts, SAMs produced from methyl-terminated diacetylene disulfide are very limited in their use. Because of the presence of the methyl group at the terminal end of the SAM blocks, the surface of the SAM according to Batchelder is considered nonreactive.

In a different vein, the art has looked at multilayer assemblies of self-assembling monolayers. For example, the formation of built up films by the stepwise adsorption of individual monolayers is described in U.S. Pat. No. 4,539,061 to Sagiv. However, these monolayers suffer from the same disadvantages as other non-polymerized monolayers. Moreover, the process described in this patent itself is limiting. That is, the process requires the use of a molecule having a polar "head" and a non-polar functional group in producing the monolayer. This is followed by a conversion of non-polar groups to a polar head in order to allow for the build up of subsequent monolayers. Accordingly, not only is the disclosed process relatively complex but the practical applications are limited.

Accordingly, the need still exists for an improved polymeric self-assembled mono- and multi-layer structure that does not suffer from the limitations associated with previous films.

SUMMARY OF THE INVENTION

Surprisingly, it has been found that certain self-assembled monolayers are capable of being formed into self-assembled multilayers, and, in particular, polymeric self-assembled multilayers. Moreover, the polymeric self-assembled mono- and multi-layers described herein have a combination of properties which allows them to be employed in a wide variety of applications such as adhesion layers and lithographic resists.

In one aspect the present invention relates to a self-assembled multi-layer structure comprising a substrate and a plurality of self-assembled monolayers, with each of said self-assembled monolayers being produced from a block containing a first functional group and a second functional group reacted with the first functional group. In one particular preferred embodiment, the first functional group is a thiol group, the second functional group is a carboxylic acid group, hydroxyl group or an epoxy group.

Moreover, at least one of the self-assembled monolayers are polymerized, e.g., produced from a compound containing at least one pair of conjugated acetylene bonds and/or a polymerizable end group and then polymerized.

In another aspect of the invention, a method of photolithography is provided. This method includes providing a support having at least one self-assembled monolayer thereon, said self-assembled monolayers produced from a molecule including at least two acetylene bonds, introducing a mask onto self-assembled monolayer in a desired pattern inducing the polymerization of the unmasked regions of the self-assembled in a plane roughly parallel to the substrate in removing the unpolymerized portion of the self-assembled monolayers. The method can further include etching of the substrate surface subsequent thereto or deposition of an inorganic or organic material thereon.

BRIEF DESCRIPTION OF THE DRAWING

FIG. 9a is a three dimensional STM image of a pattern Au surface and FIG. 9b is a depth profile on the line of FIG. 9a.

DESCRIPTION OF THE PREFERRED EMBODIMENTS

Figure 1:
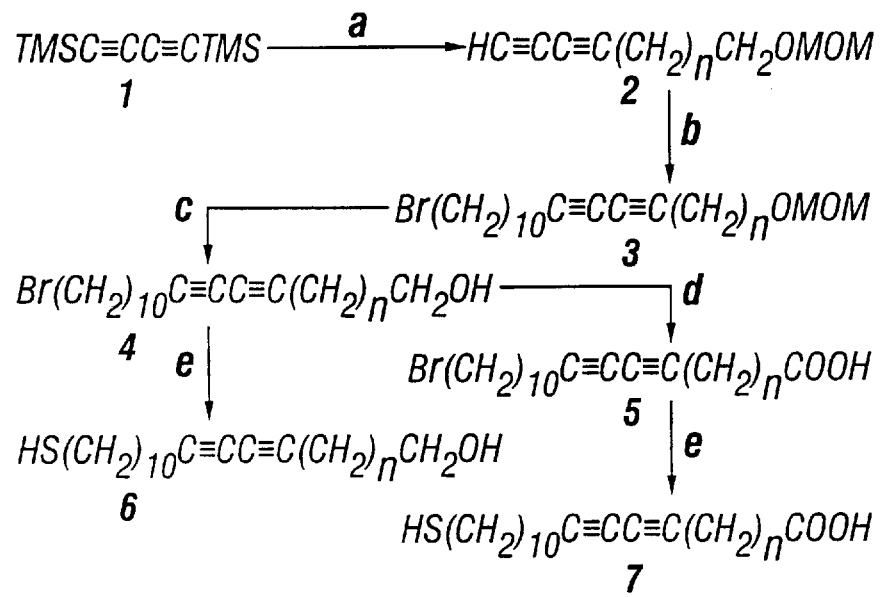
FIG. 1 illustrates a synthesis method for producing diacetylenic thiols which can be employed in the present invention.

The self-assembled monolayers employed in the present invention are produced from molecules or blocks that include at least two functional groups, i.e., a first functional group capable of being attached to a surface, and a second functional group which is capable of being covalently bonded with the first functional group of another molecule or block. The use of blocks having such a combination of functional groups allows for the sequential buildup of monolayers on a surface.

Examples of suitable first functional groups include thiol groups, carboxylic acids and silanes, with thiols being preferred.

The selection of suitable second functional groups is dependent, of course, on the first functional group employed. For example, preferred second functional groups for use where the first functional group is a thiol include carboxylic acid groups, hydroxy groups, and epoxy groups.

As discussed above, it is also desirable that the SAM be polymerizable. While the various applications associated with the present invention can utilize SAMs polymerized by any known technique, the following two methods are discussed herein.

In one embodiment for providing a polymerizable SAM, it is desired that the self-assembled monolayers be produced from molecule or blocks containing at least one pair of conjugated acetylene bonds. While the conjugated bonds can be placed at any suitable location in the block, near or at the center of the molecule is preferred. By center it is meant that there are about the same number of carbon atoms on both sides of the conjugated bonds. SAMs produced from such blocks are typically polymerized by irradiation, e.g., UV, visible light, infrared, x-rays, and the like with UV irradiation being preferred.

Another method of providing a polymerizable SAM involves the use of polymerizable second functional or end groups. Examples of such groups, which can be polymerized through irradiation or electrochemistry, include aniline groups, thiophene groups and pyrrole groups.

Combinations of the foregoing could also be employed. For example, a multi-layer including one or more monolayers produced from blocks with conjugated acetylene bonds and one or more layers produced from compounds having polymerizable end groups. Moreover, blocks containing both conjugated acetylenic groups and polymerizable end groups can be employed.

The use of SAMs produced from conjugated acetylene bonds is preferred due to the fact that the polymerization of SAMS with polymerizable end groups results in a material that is not further reactive. That is, by polymerizing the end groups further reaction of the SAM is not possible.

Preferred examples of suitable blocks for forming the monolayers include organomercaptans such as diacetylenic thiols, e.g., ω-functionalized n-alkanethiols. The compounds preferably have from 4–40 carbon atoms, more preferably 20–30, and still more preferably about 25 carbon atoms. Specific examples of suitable compounds include ω-functionalized n-alkanethiols containing a diacetylene group such as $HS(CH_2)_{10}C\equiv CC\equiv C(CH_2)_{10}COOH$ and $HS(CH_2)_{10}C\equiv CC\equiv C(CH_2)_{10}OH$.

Methods for producing SAMs in which the desired functional groups disclosed in the two Kim et al. articles discussed above and thus need not be described in detail here. However, for sake of completeness, FIG. 1 illustrates a suitable synthesis technique. As illustrated in this figure, the synthesis of diacetylene-containing alkanethiols includes the selective deprotection of 1,4-bis(trimethylsilyl)-1,3-butadiyne (1 of FIG. 1), subsequent reaction with primary alkylbromides and deprotection of the remaining trimethylsilyl group. The lithium diacetylenide (2 of FIG. 1) can then be reacted with 1,10-dibromodecane to give a functionalized alkylbromide (3 of FIG. 1). Oxidation of the alkylbromide provided a diacetylene (5 of FIG. 1) that is then converted to the corresponding thiols (6,7 of FIG. 1).

Where conjugated acetylenic bonds are employed, polymerization of the SAMs in a plane which is roughly parallel to the surface of the substrate can be performed through irradiation with, e.g., visible light, infrared, x-ray or UV radiation, with UV being preferred. See, for example, the discussion in the two Kim et al. articles and the Batchelder et al. article. As discussed above, the use of polymerizable end groups allows for polymerization through electrochemical techniques that are also recognized in the art.

Figure 2:
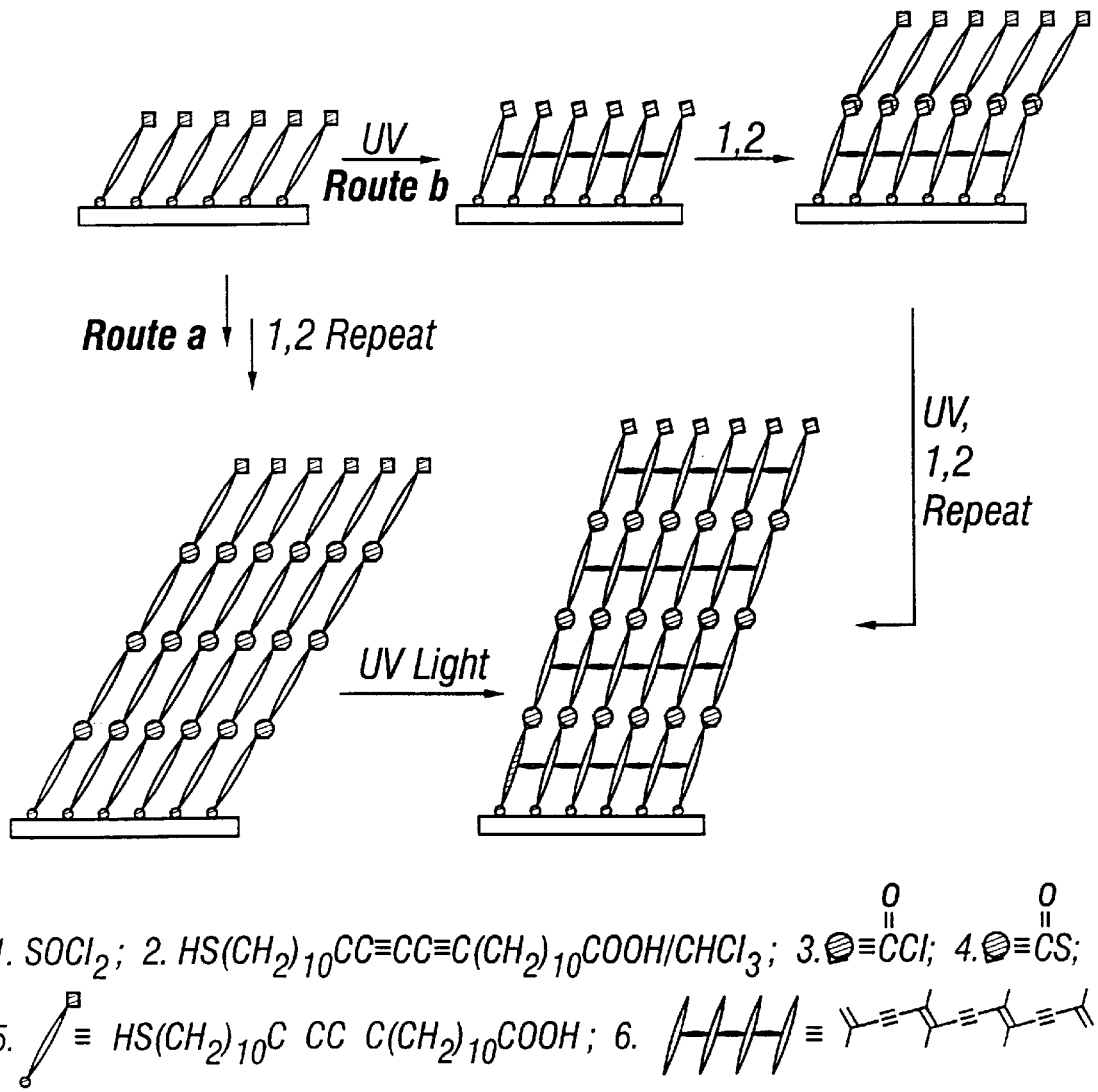
FIG. 2 illustrates a method for forming a polymeric self-assembled mono- or multilayer.

Multilayers assemblies of self-assembled monolayers are produced through the sequential deposition of a plurality of SAMs (FIG. 2).

In particular, the individual monolayers are covalently bonded to the immediate preceding layer through the reaction of the second functional group of a first block with the first functional group of a second block. For example, where the second functional group is a carboxylic acid and the first functional group is a thiol, the acid is converted to an acid chloride and the layers are then covalently bonded through a thioester linkage. The conditions associated with such processes would be well within the purview of those skilled in the art.

Moreover, other suitable combinations of functional groups capable of providing a covalent bond between the individual layers would also become apparent to hose skilled in the art and can also be employed.

Polymeric multilayers according to the present invention are preferably produced by either of two synthesis routes illustrated in FIG. 2. Although the following discussion with focus on the preferred use of the carboxylic acid-terminated alkanethiol diacetylene $HS(CH_2)_{10}C\equiv CC\equiv C(CH_2)_{10}COOH$, it should not be limited to that particular molecule.

In general, synthesis Route a illustrates the ability to provide an assembled multilayer in which the assembly of individual monolayers is provided and are polymerized during production of the multilayer but, which subsequent to polymerization, each layer is polymerized.

Alternatively, Route b illustrates a synthesis method by which each layer is polymerized as it is introduced onto the previous layer.

As can be seen, both routes involve the same process for introducing the SAM onto the substrate or the previous SAM layer, i.e., converting the carboxylic acid terminal groups to an acid chloride by exposure to $SOCl_2$ vapor followed by subsequent reaction with the desired block. The significant difference between the two routes is the timing of the irradiation, i.e., either once after depositing all of the SAMs or after the deposition of each SAM.

The present invention is therefore capable of providing an arrangement exists where all of the layers are polymerized or, where one or more of the outermost layers may not be polymerized with the balance of the layers being polymerized.

Surprisingly, not only are the polymerized SAMs are extremely rugged, they are better barriers to transfilm mass transfer than unpolymerized monolayers. Accordingly, it has been discovered that the self-assembled mono- and multilayers according to the present invention can be employed as an adhesion layer in a variety of environments.

One such area is as adhesion layers. Adhesion layers are, in general, known in the art and can be employed in a number of different environment. Such layers can allow the formation of composite materials which are otherwise difficult, if not impossible, to provide. For example, merely introducing a layer of gold onto silicon is ineffective due to poor compatibility, and the gold will peel off in a matter of days. On the other hand, through the use of a suitable adhesion layer, e.g., chromium, which is capable of bonding to both the gold and the silicon, suitable composites can be provided.

Here, self-assembled mono- and multilayers and in particular, polymerized mono- and multilayers according to the present invention can be employed as adhesion layers in a variety of environments. First of all, the ability of SAMs to bond to a variety of substrates under a wide range of conditions, e.g., temperatures less than about 400C., makes their use attractive in this context. Moreover, as discussed above, once polymerized, the SAMs are stronger, more resistant to degradation, and thus, can provide even better adhesion.

Specific examples of suitable substrates include gold, aluminum, aluminum oxide, gallium-arsenide, copper and silver.

Moreover, upon introduction of a self-assembled mono- or multilayer onto a substrate, additional outer layers can be provided. Such additional layers are limited only by their ability to react with the second functional group of the SAM and the intended final use for the composites. Specific examples of such "outer layers" include chemically sensitive organic and inorganic materials, metals and semiconductors to name a few.

The multilayer assemblies according to the present invention are capable of providing additional advantages. In this regard, a polymerized multilayer provides a highly structured three-dimensional, surface-confined polymer which can be employed as, e.g., ordered conductive polymers, third-order nonlinear optical materials and, one particularly preferred embodiment, lithographic resists.

Figure 3:
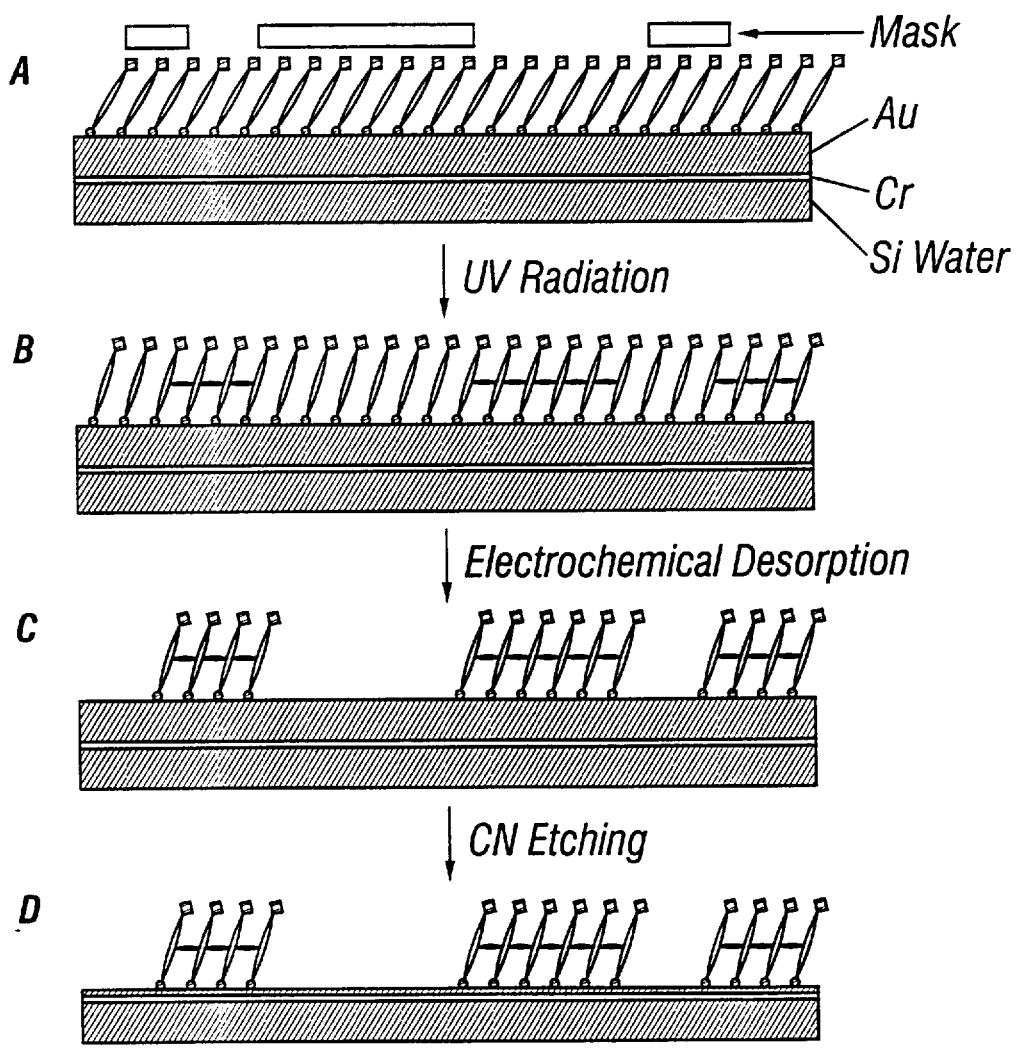
FIG. 3 illustrates a method of photolithography according to the present invention.

A method for using self-assembled mono- and multilayers as a photoresist and, in particular, a negative photoresist, is illustrated by FIG. 3.

This aspect of the invention involves the use of a self assembled mono or multilayer and the introduction of a suitable mask in a desired pattern onto the surface of the mono- or multilayer. The self-assembled monolayer is then irradiated with UV radiation, so as to induce polymerization in the unmasked regions of the mono- or multi-layer.

The unpolymerized portion of the resist is then selectively desorbed using a suitable electrochemical reductive stripping method which results in a negative image of the mask. Selective stripping can be effectively employed in this process because the polymeric mono- or multilayers are sufficiently insoluble in the stripping agent and strongly bond to the surface that only the monomeric SAMs are removed. Finally, suitable processing, e.g., etching can be preformed to elaborate on the negative image of the mask in providing the desired resist. Alternatively, this can involve deposition of an inorganic or organic material thereon.

The individual steps discussed above, e.g., selective stripping, etching, depositions and the like, can be performed with traditional materials and by traditional techniques. In fact, the ability to readily and easily "plug" the resists of the present invention into existing processes without the costs in both time and money associated with retrofitting or redesigning is a significant advantage of the inventive process.

Moreover, because the use of self-assembled mono- or multilayer consist of single small molecules or very thin layers of molecules, the theoretical resolution of lithography is the graphically defined features can be as small as a few (e.g., less than 10) nanometers when patterned by an appropriate tool, e.g., the tip of scanning tunnel microscope.

SAMs are extremely dense and, in some cases the structure approaches that of a two-dimensional crystal. This ensures high effective density and simplifies resist application and stripping. In fact, the use of stripping solutions can be greatly minimized or eliminated. The environmental impact of that advantage in terms of eliminating the need to process or dispose such solution can not be understated.

Finally, insofar as the terminal group, i.e., second functional group, of the SAMs can be varied, selective chemicals physical vapor definition of materials can be enhanced.

The present invention will now be described in terms of certain preferred examples thereof. However, these examples are intended to be illustrative in nature and should, in no way, limit the present invention.

EXAMPLE 1

Gold substrates for FTIR-external reflectance spectroscopy (FTIR-ERS), ellipsometry, and Raman spectroscopy were prepared by thermal evaporation of 2000 Å of Au over a 50-Å Cr adhesion layer confined to Si(100). For UV-vis measurements, transparent substrates were prepared by thermal deposition of 50 Å of Au onto a (3-mercaptopropyl) trimethoxysilane adhesion layer confined to a quartz substrate. The substrates were cleaned in piranha solution (30% $H_2O_2$:concentrated $H_2SO_4$=1:3).

Monolayers were prepared by soaking the substrate in a 1 mM $CHCl_3$ solution of $HS(CH_2)_{10}C\equiv CC\equiv C(CH_2)_{10}COOH$ for 1h, removing the substrate, and then rinsing it in acetone and deionized water. Multilayers were prepared by thioester coupling of $HS(CH_2)_{10}C\equiv CC\equiv C(CH_2)_{10}COOH$ to the base monolayer either before or after polymerization of the base layer. The carboxylic acid-terminated SAM was positioned in a closed container, and after the container was purged with dry $N_2$ for 5 min, $SOCl_2$ vapor was introduced for 10 min. Control experiments, which involved monitoring this reaction by FTIR-external reflectance spectroscopy in real time, indicated that the absorbance due to the carboxylic acid carbonyl stretching mode originally present around 1713 $cm^{-1}$ was completely eliminated within 1 min and replaced by an absorbance at 1813 $cm^{-1}$ that we identify as the acid chloride carbonyl mode. The substrate was then transferred to a 1 mM $CHCl_3$ solution of $HS(CH_2)_{10}C\equiv CC\equiv C(CH_2)_{10}COOH$, and thioester formation was complete with 1h. Subsequent layers were prepared similarly.

Except for the UV-vis spectroscopic experiments, polymerization was performed by placing the substrate into a gas-tight container and irradiating it under a $N_2$ purge for 5 min with a lamp (Oriel, Model 6035) positioned 1 cm above the substrate.

FTIR-ERS measurements were made using a Digilab FTS-40 FTIR spectrometer equipped with a Harrick Scientific Seagull reflection accessory and a liquid $N_2$-cooled MCT detector. All spectra were obtained using p-polarized light incident on the Au substrate at an angle of 84°.

Thickness measurements of the unpolymerized mono- and multi-layers were made using a Gaertner Scientific ellipsometer (Model L116C). The data were obtained using the 488 nm Ar laser line, but the 633 nm He—Ne laser line yielded similar results. A refractive index of 1.46 was assumed for the thickness calculations. Due to optical absorptions it was not possible to measure the thickness of the polymerized multilayer SAMs using ellipsometry.

The UV-vis spectra were recorded on a Hewlett-Packard diode-array spectrometer by first obtaining a background spectrum of a four-layer, unpolymerized film, and then polymerizing it for various lengths of time without removing the substrate from the spectrometer (in these experiments the UV light was maintained 0.5–1.0 cm away from the substrate). Throughout these experiments the substrate was kept under a $N_2$ purge.

The Raman measurement system consists of a Kr-ion laser (Model Innova 90K, Coherent Laser Group, Santa Clara, Calif.), a 3-in.-diameter holographic notch filter (Model Notch-Plus, Kaiser Optical System, Ann Arbor, Mich.), 0.5-m single-grating Czerny-Turner spectrograph (Model 500M, SPEX Industries, Edison, N.J.), a liquid-$N_2$-cooled 1024-by-26-pixel charge-coupled device (CCD) (Model CCD-1000LF, SPEX Industries). Laser power was measured by a semiconductor detector (Model 840-C and 818-SL/CM, Newport, Irvine, Calif.). The spectral position, of the horizontal CCD pixels were calibrated using emission lines of known wavelengths from a Ne lamp (Model A1A/NE-2, Chicago Miniature Lamp, Buffalo, Ill.). Typical conditions for Raman scattering were 5 mW 647.1 nm excitation 200 mm slit width (equivalent to 6.7 cm$^{-1}$ band pass), and 5s integration time. The spectra were corrected for a slowly varying spectral background using set points more than 200 cm$^{-1}$ apart. The laser was focused to a point on the sample surface using a f=250 mm spherical focusing lens.

Figure 4:
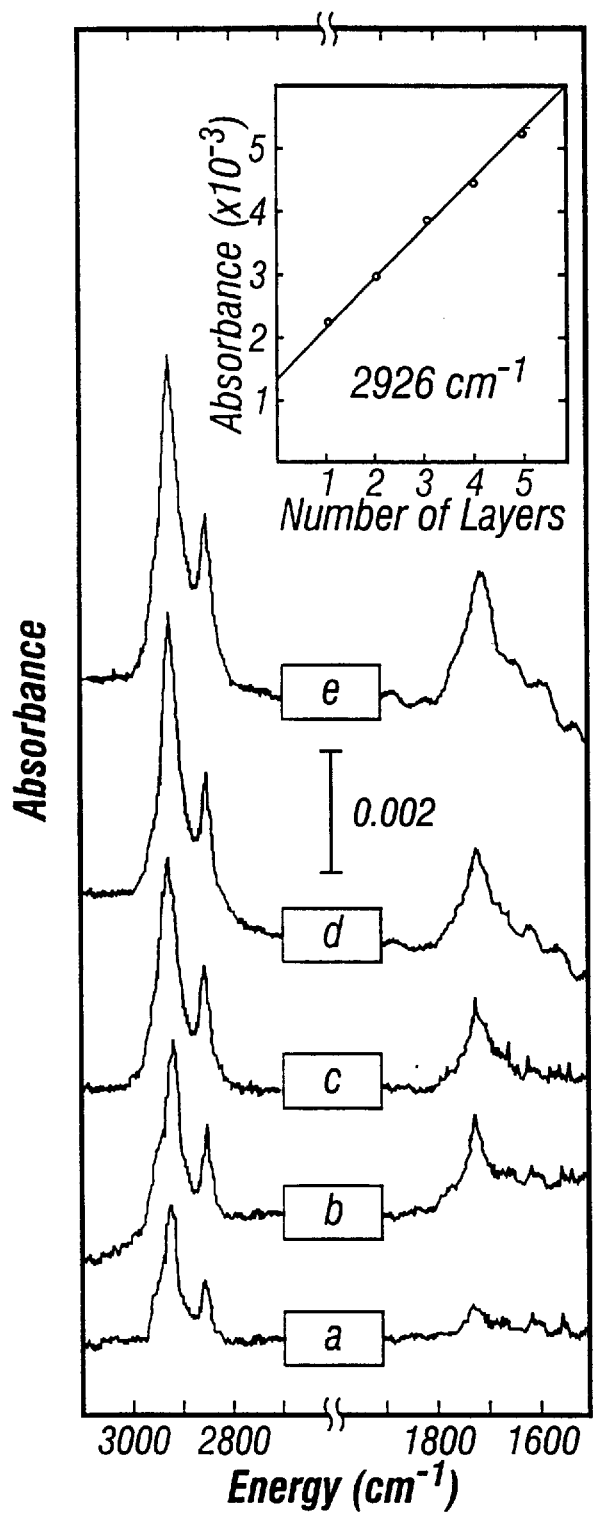

FIG. 4 shows FTIR-ERS spectra of HS(CH$_2$)$_{10}$C≡CC≡C(CH$_2$)$_{10}$COOH obtained after each of five incremental increases in layer thickness and subsequent polymerization immediately following the addition of each layer (Route b). FIG. 4-a corresponds to a single, polymerized monolayer of HS(CH$_2$)$_{10}$C≡CC≡C(CH$_2$)$_{10}$COOH. The spectrum is composed of three prominent peaks: methylene asymmetric and symmetric C—H stretches at 2926 and 2854 cm$^{-1}$, respectively, and the carboxylic acid ○□○ stretch at 1713 cm$^{-1}$. The positions of the methylene bands are in general agreement with previous studies, and they indicate that the hydrocarbon portions of the chains probably exist in a liquid-like state. As discussed later, the absorbance of the methylene bands in the second and subsequent layers is greatly attenuated following polymerization due to a change in orientation of the hydrocarbon backbone relative to the Au substrate.

After obtaining the spectrum in FIG. 4a, we reacted the terminal acid groups with SOCl$_2$ to convert them to the acid chloride, which reacts with HS(CH$_2$)$_{10}$C≡CC≡C(CH$_2$)$_{10}$COOH to form a thioester-bound bilayer. Exposure to UV light polymerizes the second layer. FIG. 4b shows that this treatment increases the absorbance due to both the methylene and carbonyl groups. The methylene band intensity increased by about 30% which is consistent with subsequent layering steps (FIG. 4c, d, e), which show the same incremental increase in absorbance observed for the second layer (inset of FIG. 4). From these data we conclude that the first polymerized layer is significantly tilted with respect to the surface normal, perhaps as much as 35° based on the ellipsometric data discussed later, but subsequent polymerized layers are oriented more perpendicular to the surface-perhaps about 20° from the surface normal based on ellipsometry data and the difference in the maximum IR absorbance.

Figure 5:
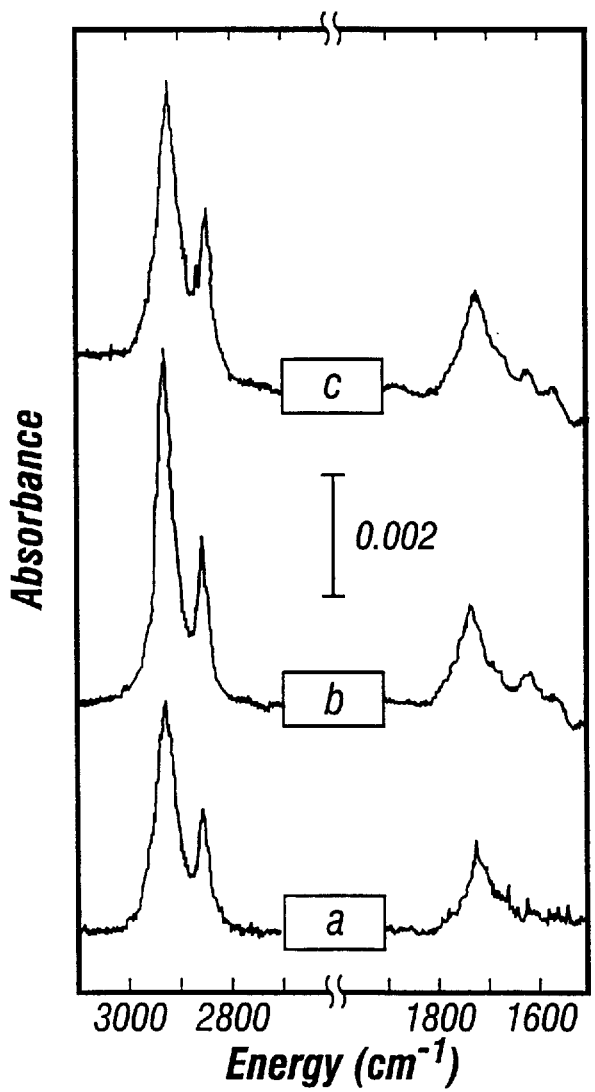

The change in orientation of the hydrocarbon backbone upon polymerization is confirmed by FIG. 5. FIG. 5a, which is the same as FIG. 4c, is a spectrum of a three-layer polydiacetylene film. FIG. 5b is the spectrum that results from coupling a fourth unpolymerized layer to the multilayer of FIG. 5a. The large change in absorbance in the hydrocarbon region is consistent with the addition of the fourth layer. However, upon polymerization (FIG. 5c) the magnitude of these peaks decreases significantly. This result suggests that the methylene bonds are oriented more parallel to the substrate after polymerization and confirms the structural change mentioned earlier.

Figure 6:
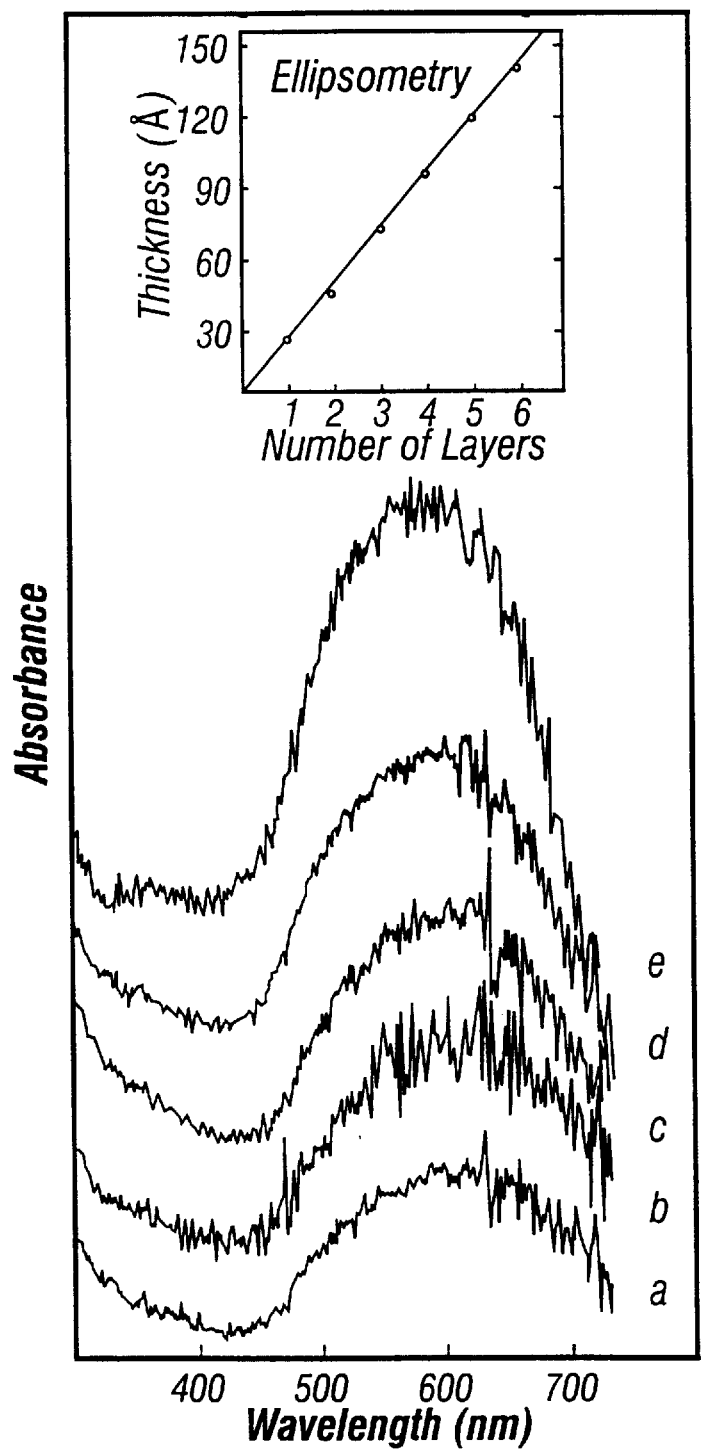

FIG. 6 also shows in situ UV-vis transmission spectra as a function of polymerization time for a 4-layer film made according to Route a (FIG. 2). The data indicate that polymerization is complete within 5 min. Exposure of the film to UV light for times up to 8 min revealed no further change in the intensity or position of the absorption maximum, which occurs at 620 nm. In studies of polydiacetylene Langmuir-Blodgett films, two absorption maxima are usually observed. One is found between 600 and 640 nm, which corresponds to the so-called blue polymer, and the other is between 500 and 550 nm, which corresponds to the shorter or less conjugated red polymer. The self-assembly approach yielded only the more highly conjugated blue polymer.

Figure 7:
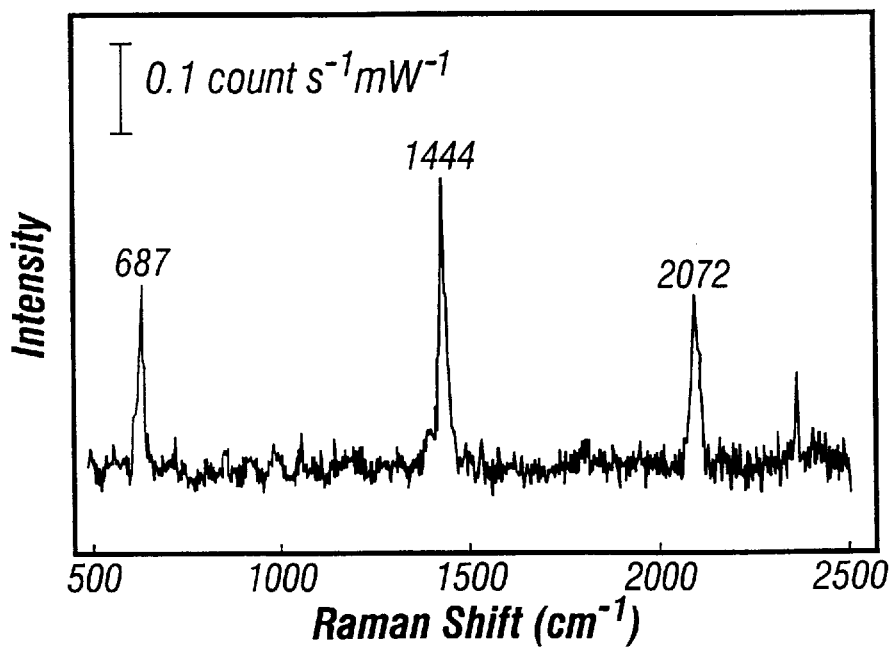
FIGS. 4–7 illustrate properties of polymeric multilayers.

The surface Raman spectrum of the same substrate used to obtain the data shown in FIG. 4 confirms polymerization (FIG. 7). Three major peaks located at 687, 1444, and 2072 cm$^{-1}$ all originate from vibrations of the polydiacetylene backbone, which contains conjugated and alternating double and triple bonds. The peak at 687 cm$^{-1}$ has previously been assigned to a bending mode of the backbone, and peaks at 1444 and 2072 cm$^{-1}$ correspond mainly to the C=C and C≡C stretching vibrations, respectively. These frequencies are significantly lower than those observed for isolated C=C and C≡C stretching modes (approximately 1620 and 2260 cm$^{-1}$, respectively). The decrease in both frequencies is due to extensive electronic delocalization in the backbone of the polymerized diacetylene groups.

EXAMPLE 2

A diacetylenic SAM was used as a negative photoresist and the image of a transmission electron microscope (TEM) minigrid was transferred into a Au substrate using the three steps illustrated in FIG. 3.

First, the minigrid was placed in contact with a SAM composed of close-packed HS—(CH$_2$)$_{10}$C≡CC≡C(CH$_2$)$_{10}$COOH molecules confined to a Au/Cr/Si surface. The entire assembly was then exposed to UV light, which induced polymerization in the unmasked regions of the SAM (B-FIG. 3). Next the unpolymerized portion of the resist was selectively desorbed using an electrochemical reductive stripping method (C-FIG. 3). Selective stripping was possible because the polymeric SAM is sufficiently insoluble and strongly bound to the surface through multiple Au/S and van der Waals interactions that it survives potential excursions that remove monomeric organomercaptan SAMs. Resist removal resulted in a negative image of the mask, which can be elaborated by etching the grid image into the Au surface with an O$_2$-saturated 1 M KOH plus 10 mM KCN aqueous solution (D-FIG. 3).

Figure 8A:
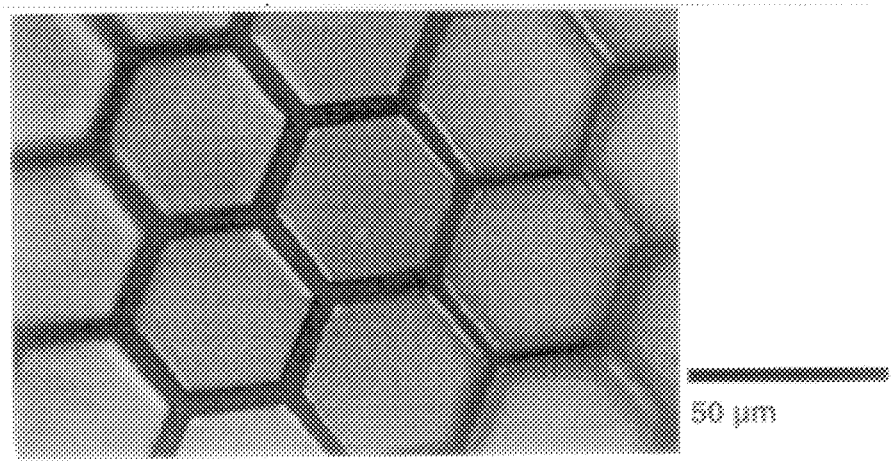
FIG. 8 are micrographs relating to the exemplified method of photolithography.
Figure 8B:
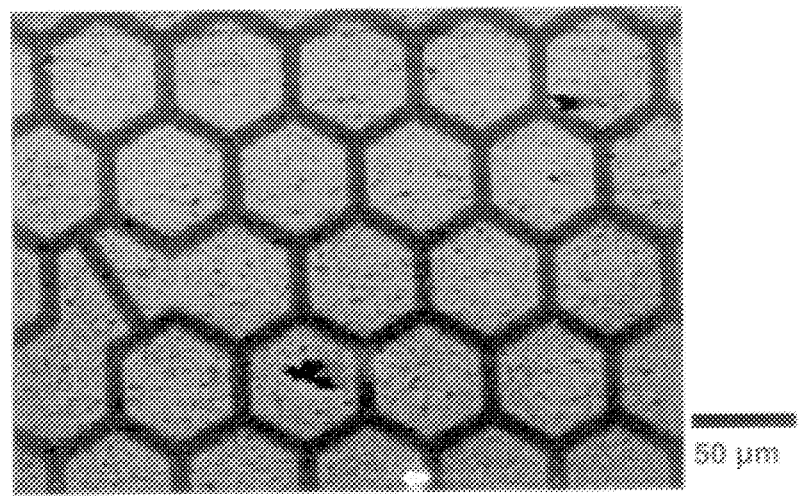
Figure 8C:
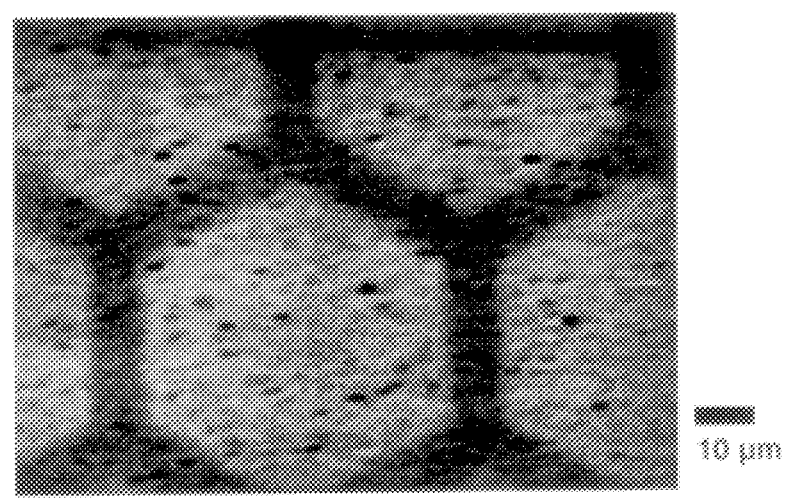

FIG. 8a is an optical micrograph of the 400-mesh (holes per linear inch) Cu TEM minigrid, which was used to pattern the Au surface. Panels b and c of FIG. 8 are scanning electron micrographs (SEMS) of a patterned Au surface, such as that illustrated in FIG. 3, frame D obtained at two different magnifications. At this level of resolution, an excellent reproduction of the mask features was observed.

Figure 9A:
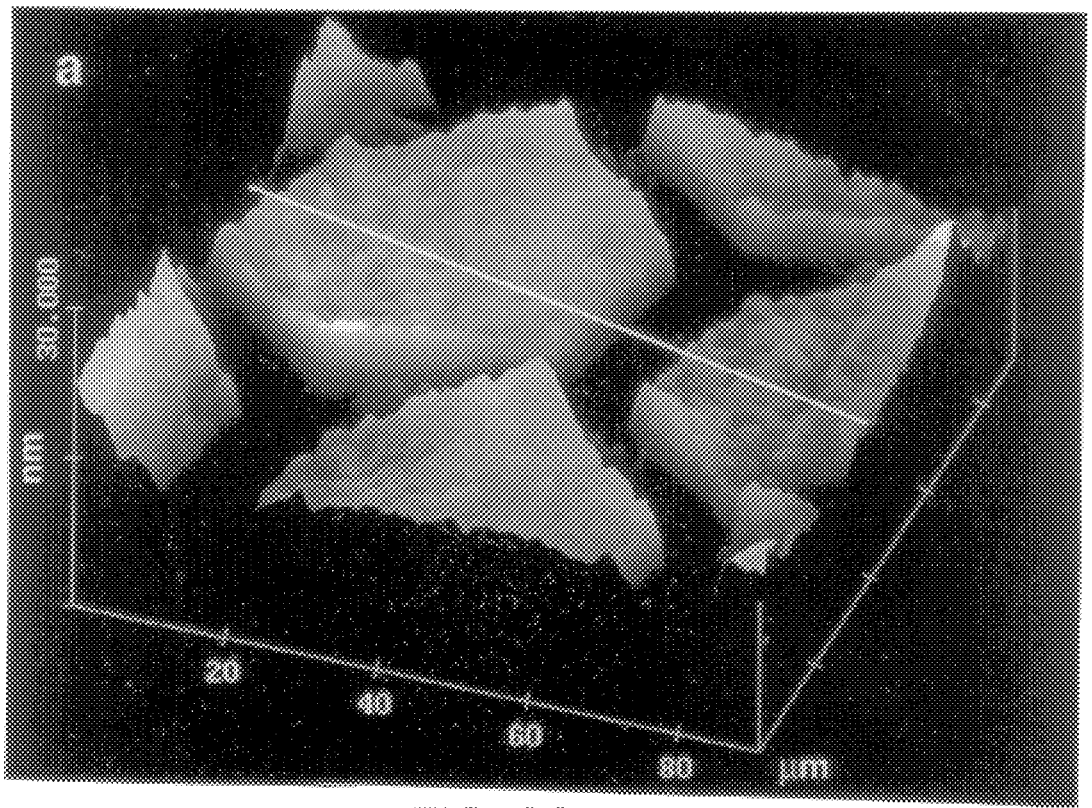
Figure 9B:
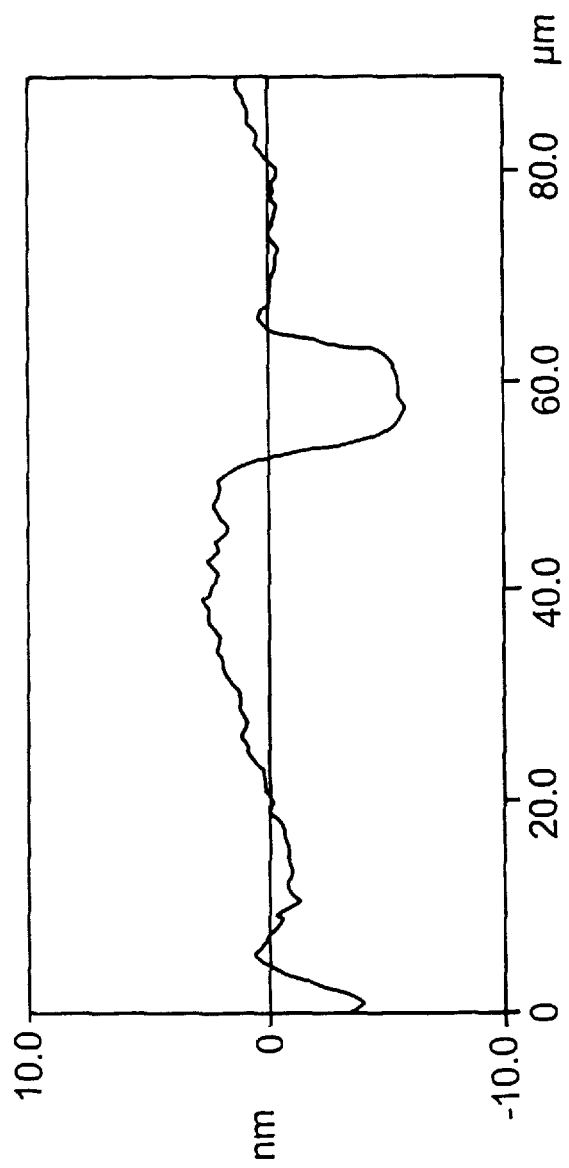

FIG. 9a is a three-dimensional STM image (90 $\mu$m×90 $\mu$m) of the pattern shown in FIG. 7b,c. The grooves in this image are regions of the Au surface that have been etched by the KCN/KOH solution, while the hexagonal regions are those parts of the Au surface that etch at a reduced rate as a result of the presence of the polymeric SAM resist. STM depth profiles (FIG. 9b) indicate the grooves were about 7–8 nm deep.

Although the present invention has been described in terms of certain preferred embodiments, those skilled in the art will recognize that various modifications, omissions, substitutions, and other changes can be made without departing from the spirit thereof. Thus, the scope of the present invention should be limited only by the scope of the following claims including equivalents thereof.

What is claimed is:

1. A self-assembled multilayer structure comprising:
 a substrate and
 a plurality of self-assembled monolayers deposited thereon, with each of said self-assembled monolayers being produced from a block containing a first functional group, a second functional group that is reactive with the first functional group, wherein at least one of the monolayers is polymerized in a plane at least substantially parallel to the substrate.

2. The structure according to claim 1 where the first functional group is a thiol, carboxylic acid or silane group.

3. The structure according to claim 1 where the second functional group is a carboxylic acid group, hydroxy group, or epoxy group.

4. The structure according to claim 1 wherein at least one of the self-assembled monolayers are produced from a compound containing at least one pair of conjugated acetylene bonds.

5. The structure according to claim 4 wherein the compound contains a pair of conjugated acetylene bonds in the center of the compound.

6. The structure according to claim 1 wherein at least one of the self-assembled monolayers is produced from a compound having a second functional group which is polymerizable.

7. The structure according to claim 1 wherein more than one of the self-assembled monolayers are polymerized in a plane at least substantially parallel to the substrate.

8. The structure according to claim 1 wherein each of the self-assembled monolayers are polymerized in a plane at least substantially parallel to the substrate.

9. The structure according to claim 1 wherein at least one of the self-assembled monolayers are produced from organomercaptans.

10. In the structure according to claim 9 wherein the organomercaptans are diacetylenic thiols.

11. The structure according to claim 10 wherein the diacetylenic thiol has the formula $HS(CH_2)_{10}C\equiv CC\equiv C(CH_2)_{10}COOH$ or $HS(CH_2)_{10}C\equiv CC\equiv C(CH_2)_{10}OH$.

12. The structure according to claim 9 wherein the organomercaptans are $\omega$-functionalized diacetylenic n-alkanethiol having 4–40 carbon atoms.

13. A multilayer structure comprising:
a substrate;
an adhesion layer comprising at least one self-assembled monolayer bonded thereto; and
at least one outer layer bonded to said adhesion layer, wherein said at least one outer layer is not compatible with said substrate, wherein at least a portion of at least one of the self assembled monolayers is polymerized in a plane at least substantially parallel to the substrate.

14. The structure according to claim 13 wherein at least one adhesion layer comprises a self-assembled monolayer which is polymerized in a plane at least substantially parallel to the substrate.

15. The structure according to claim 13 further comprises one or more additional layers between the substrate and the adhesion layer.

16. A method for photolithography comprising:
(a) providing a substrate and at least one self-assembled monolayer on said substrate, said self-assembled monolayer being produced from a molecule including at least two acetylene bonds;
(b) introducing a mask onto said self-assembled monolayer in a desired pattern;
(c) inducing the polymerization of the unmasked regions of the self-assembled monolayer in a plane parallel to the substrate; and
(d) removing the unpolymerized portion of the at least one self-assembled monolayer.

17. The method according to claim 16 further comprising (e) etching of the surface of the substrate.

18. The method according to claim 16 further comprising (e) deposition of an inorganic or organic material onto the substrate.

19. A method of photolithography comprising the step of generating a photoresist pattern on a substrate, said resist pattern comprising at least one polymeric self-assembled monolayer, wherein at least a portion of at least one of the self assembled monolayers is polymerized in a plane at least substantially parallel to the substrate.

* * * * *